(12) United States Patent
Chen et al.

(10) Patent No.: US 10,959,335 B2
(45) Date of Patent: Mar. 23, 2021

(54) METHOD FOR MANUFACTURING A TRANSPARENT CONDUCTIVE FILM

(71) Applicants: IVTOUCH CO., LTD., Suzhou (CN); SOOCHOW UNIVERSITY, Suzhou (CN)

(72) Inventors: Linseng Chen, Suzhou (CN); Xiaohong Zhou, Suzhou (CN)

(73) Assignees: IVTOUCH CO., LTD., Suzhou (CN); SOOCHOW UNIVERSITY, Suzhou (CN)

( * ) Notice: Subject to any disclaimer, the term of this patent is extended or adjusted under 35 U.S.C. 154(b) by 147 days.

(21) Appl. No.: 16/338,720

(22) PCT Filed: Sep. 18, 2017

(86) PCT No.: PCT/CN2017/101995
§ 371 (c)(1),
(2) Date: Apr. 2, 2019

(87) PCT Pub. No.: WO2018/072578
PCT Pub. Date: Apr. 26, 2018

(65) Prior Publication Data
US 2020/0413546 A1  Dec. 31, 2020

(30) Foreign Application Priority Data
Oct. 19, 2016 (CN) .......................... 201610907841.X

(51) Int. Cl.
*H05K 3/02* (2006.01)
*H05K 3/10* (2006.01)
(Continued)

(52) U.S. Cl.
CPC ............. *H05K 3/107* (2013.01); *G06F 3/044* (2013.01); *H05K 3/0014* (2013.01); *H05K 3/02* (2013.01);
(Continued)

(58) Field of Classification Search
USPC .......................... 29/846, 825, 829, 847, 849
See application file for complete search history.

(56) References Cited

U.S. PATENT DOCUMENTS 7,968,804 B2 * 6/2011 Frey ........................ C23C 18/38
174/392
2012/0097424 A1 * 4/2012 Jo ........................ G02F 1/13439
174/126.4
(Continued)

FOREIGN PATENT DOCUMENTS

CN  103235666 A  8/2013
CN  103295671 A  9/2013
(Continued)

*Primary Examiner* — Thiem D Phan
(74) *Attorney, Agent, or Firm* — SZDC Law P.C.

(57) ABSTRACT

A method for manufacturing a transparent conductive film includes: using a mold to stamp on a transparent insulating substrate to obtain continuous grooves; or coating a gel layer on a transparent insulating film, then using a mold to stamp on one plane of the gel layer which is away from the transparent insulating film, so as to form solidified grooves; filling the grooves with conductive materials to generate a conductive layer, i.e., an inner circuit; forming an outer circuit on the surface in contact with the conductive layer; removing the unnecessary conductive materials in the inner and outer circuit in accordance with a preset graphic to form insulating channels, and insulating lines; obtaining a transparent conductive film. Screen printing and embedded nanoimprinting are combined, and a unified grid filling system is used as a general-purpose mold to manufacture a transparent conductive film.

6 Claims, 5 Drawing Sheets

(51) Int. Cl.
*G06F 3/044* (2006.01)
*H05K 3/00* (2006.01)
*H05K 3/12* (2006.01)

(52) U.S. Cl.
CPC ..... *H05K 3/12* (2013.01); *G06F 2203/04103* (2013.01); *G06F 2203/04112* (2013.01); *Y10T 29/49155* (2015.01)

(56) References Cited

U.S. PATENT DOCUMENTS

2014/0152917 A1* 6/2014 Lee ................. G06F 3/0446
    349/12
2014/0356582 A1* 12/2014 Zhang ............... G06F 3/0443
    428/172

FOREIGN PATENT DOCUMENTS

| CN | 103456390 A | 12/2013 |
|----|-------------|---------|
| CN | 105448423 A | 3/2016  |
| CN | 106547397 A | 3/2017  |

* cited by examiner

METHOD FOR MANUFACTURING A TRANSPARENT CONDUCTIVE FILM

CLAIM OF PRIORITY

The present application is the national stage application of PCT/CN2017/101995, filed on Sep. 18, 2017, which claims priority from Chinese patent application CN 201610907841.X filed on 19 Oct. 2016, the content of which is hereby incorporated by reference into this application.

TECHNICAL FIELD

The present invention relates to a touch panel, and more particularly, to a method for manufacturing a transparent conductive film having a touch function, and a transparent conductive film produced by the method and a touch panel including the transparent conductive film.

BACKGROUND

With the development of the technology, touch-functional display screens are more and more widely used in electronic products, such as mobile phones, tablets, home appliances and so on to support a "user friendly" graphical user interface. Touch panels, as the latest computer input device, are the easiest, convenient and natural way for human-computer interaction. The existing touch panels are categorized into resistance technology, capacitance technology, infrared technology, and surface acoustic wave technology, etc, in terms of principles. In recent years, the popular capacitive touch panel mainly has a conductive film of indium tin oxide (ITO) on the inner surface and the interlayer of the glass screen. Since indium is a rare, expensive, and unyielding element with a high resistance, it is unfavorable for industrial manufacture and sales. Whereas another type of capacitance touch panel has a conductive film made of nano-silver grids. And the method for manufacturing the above-mentioned conductive film comprises: stamping the designed metal grid groove on the surface of the polymer via molds; then filling the nano-silver materials to form the conductive film. As for the conductive films and the circuits thereof belong to different types or come from different manufacturers, they need different molds with specific patterns for their fabrication. However, the high production cost and the long development cycle cannot meet the requirements of diversification, low cost and short period for small or medium sized products.

SUMMARY

In order to solve the above technical problems, the present invention provides a transparent conductive film manufacturing method and product by using a type of general-purpose mold.

With the purpose for the above object, the technical solution of the present invention is as follows:

A method for manufacturing a transparent conductive film, comprising:

providing a mold with continuous convex grids microstructure units on its surface;

providing a transparent insulating substrate;

exploiting the mold to stamping on the transparent insulating substrate to form continuous grooves;

filling the grooves with conductive materials to form an interconnected grid conductive layer;

the interconnected grid conductive layer is an inner circuit, a plurality of conductive lines in contact with the inner lay are configured to electrically connect with the inner line to form an outer circuit, the plurality of conductive lines are insulated to each other;

removing the conductive materials in the grooves where the inner circuit is located according to the preset graphics, to form insulating channels and conductive channels, so as to obtain the inner circuit for the transparent conductive film.

The outer circuit of the present invention comprises a plurality of conductive lines which are directly formed on the conductive layer by screen printing or inkjet printing to electrically connect with the conductive layer. The manufacturing method for this present invention further comprises: etching the outer circuit by laser or chemicals according to the preset graphics, removing the etched conductive slurries or materials to form the conductive lines and conductive channels which are insulated to each other.

In the present invention, the outer circuit is formed at the edge of the side in contact with the conductive layer specifically through three ways: the outer circuit is tangent to the inner circuit; or the outer circuit (i.e., its contact terminal) extends into the inner circuit; or the outer circuit (i.e., its contact terminal) partly intersects the inner circuit, i.e., lap mode.

The microstructure units in this present invention are composed of continuous grids which are uniformly or non-uniformly arranged, the shape of the grid is one or a combination of at least two from the shapes of square, rectangle, rhombus, diamond, pentagon, hexagon, and random-shaped grid.

The present invention also discloses a transparent conductive film which is produced by the method for manufacturing a transparent conductive film of the present invention.

As one embodiment, the transparent conductive film comprises:

a transparent insulating substrate defining: (i) a first surface having a plurality of uniformly or non-uniformly arranged and interconnected grid grooves on itself; (ii) a second surface corresponding to the first surface.

a concave inner circuit configured on the first surface, comprising a plurality of uniformly arranged conductive channels and insulating channels between every two conductive channels, and the insulating channels further comprises a single or plurality of insulating sub-channels, the grooves corresponding to the conductive channels are filled with conductive materials whereas the grooves corresponding to the insulating channels are not filled;

a convex outer circuit configured on the first surface, comprising a plurality of conductive lines arranged according to a preset graphic and insulating lines between every two conductive lines, and the conductive lines are configured to electrically connect to the conductive channels filled with conductive materials.

As another one embodiment, the transparent conductive film comprises:

a transparent insulating substrate, containing an upper surface and a lower surface corresponding to the upper surface;

a gel layer configured on the upper surface, comprising a first surface away from the upper surface and a second surface corresponding to the upper surface, and the first surface further comprises uniformly or non-uniformly arranged and interconnected grid grooves on itself;

a concave inner circuit configured on the first surface, comprising a plurality of uniformly arranged conductive channels and insulating channels disposed between every two adjacent conductive channels, and the insulating channels further comprises a single or plurality of insulating sub-channels, the grooves corresponding to the conductive channels are filled with conductive materials whereas the grooves corresponding to the insulating sub-channels are not filled;

a convex outer circuit configured on the first surface, comprising a plurality of conductive lines arranged according to a preset graphic and insulating lines disposed between every two adjacent conductive lines, and the conductive lines are electrically connecting to the conductive channels filled with conductive materials.

Preferably, the insulating channels in the present invention are evenly arranged, and composed of a single or plurality of insulating sub-channels. The insulating sub-channels are 1 μm~10 mm wide, and at least greater than the width of the grooves. Moreover, the width of the insulating sub-channel is greater than the width of the groove and less than the width between two adjacent grooves.

Preferably, the conductive lines are partly filled in the grooves. The grooves are 1~10 μm deep and 1~5 μm wide, the conductive lines are 5~15 μm thick.

The present invention discloses a touch panel as well, which comprises a transparent conductive film prepared by the foregoing method.

The advantages and benefits of the present invention over the prior art are specifically as follows:

The present invention combines screen printing technology with embedded nano-imprinting technology. As for the traditional ITO process, it usually comprises an etching process, which can not only lead to a large amount waste for the ITO materials, but also result in a color block problem of alternating light and dark. Additionally, the resistance of ITO is too large to fit for the large-sized products. While embedded nano-imprinting system with a resistance less than $10\Omega^2$ can meet the special requirement for the large-sized products. However, the high cost for manufacturing molds, the long development cycle, as well as the poor universal applicability of the molds for different models have created a bottleneck. Thus, we propose an improvement based on this technology, wherein screen printing is combined with embedded nano-imprinting, and a type of uniform grids filling system are used as a general-purpose mold. The mold can be applied to a plurality of models, as long as silk screen and laser are performed according to different specifications. It can effectively cut down the cost and development cycle. Moreover, the line width of the metal grid and the spacing of the metal grid lines meet the need for transmittance. Besides, a unified grid design guarantees the overall visual effect for the products. And the embedded structure of the present invention can prevent the oxidation of nanosilver to maintain an excellent electrical performance. The last but not least, the etching width of the laser is only 10~30 μm, so that it is small enough to realize the narrow frame design.

DETAILED DESCRIPTION

FIG. 1 is a flow chart showing a method for manufacturing a transparent conductive film according to an embodiment of the present invention.

FIG. 2 is a schematic structural view of a mold according to an embodiment of the present invention.

FIG. 3 is a schematic partial structural view of a transparent conductive film according to the first embodiment of the present invention.

FIG. 4 is a schematic sectional view of conductive channels in a transparent conductive film according to the first embodiment of the present invention.

FIG. 5 is a schematic sectional view of insulating channels in a transparent conductive film according to the first embodiment of the present invention.

FIG. 6 is a schematic sectional view of conductive lines in a transparent conductive film according to the first embodiment of the present invention.

FIG. 7 is a schematic sectional view of insulating lines in a transparent conductive film according to the first embodiment of the present invention.

FIG. 8 is a schematic sectional view of conductive channels in a transparent conductive film according to a second embodiment of the present invention.

FIG. 9 is a schematic sectional view of insulating channels in a transparent conductive film according to the second embodiment of the present invention.

FIG. 10 is a schematic sectional view of conductive lines and insulating lines in a transparent conductive film according to the second embodiment of the present invention.

BRIEF DESCRIPTION OF THE DRAWINGS

Hereinafter, the preferred embodiments of the present invention will be described with reference to the drawings.

A transparent conductive film is composed of a conductive area and a non-conductive area. The conductive area is composed of an inner circuit and an outer circuit, whereas the non-conductive area comprises grid lines without conductive materials in their grooves. In a preferred embodiment, the lines or the channels in the conductive area are divided with a preferable interval of 20 μm by laser or chemicals etching method. The shapes of the grids in the conductive area are randomly designed, such as square, rectangle, rhombus, diamond, pentagon, hexagon, random-shaped grid, etc. The dividing lines can be etched to a single or plurality of straight or oblique lines, and independent from the channel shape in the conductive area. The grid line structure is an embedded groove structure and a metal grid structure as well.

Figure 1:
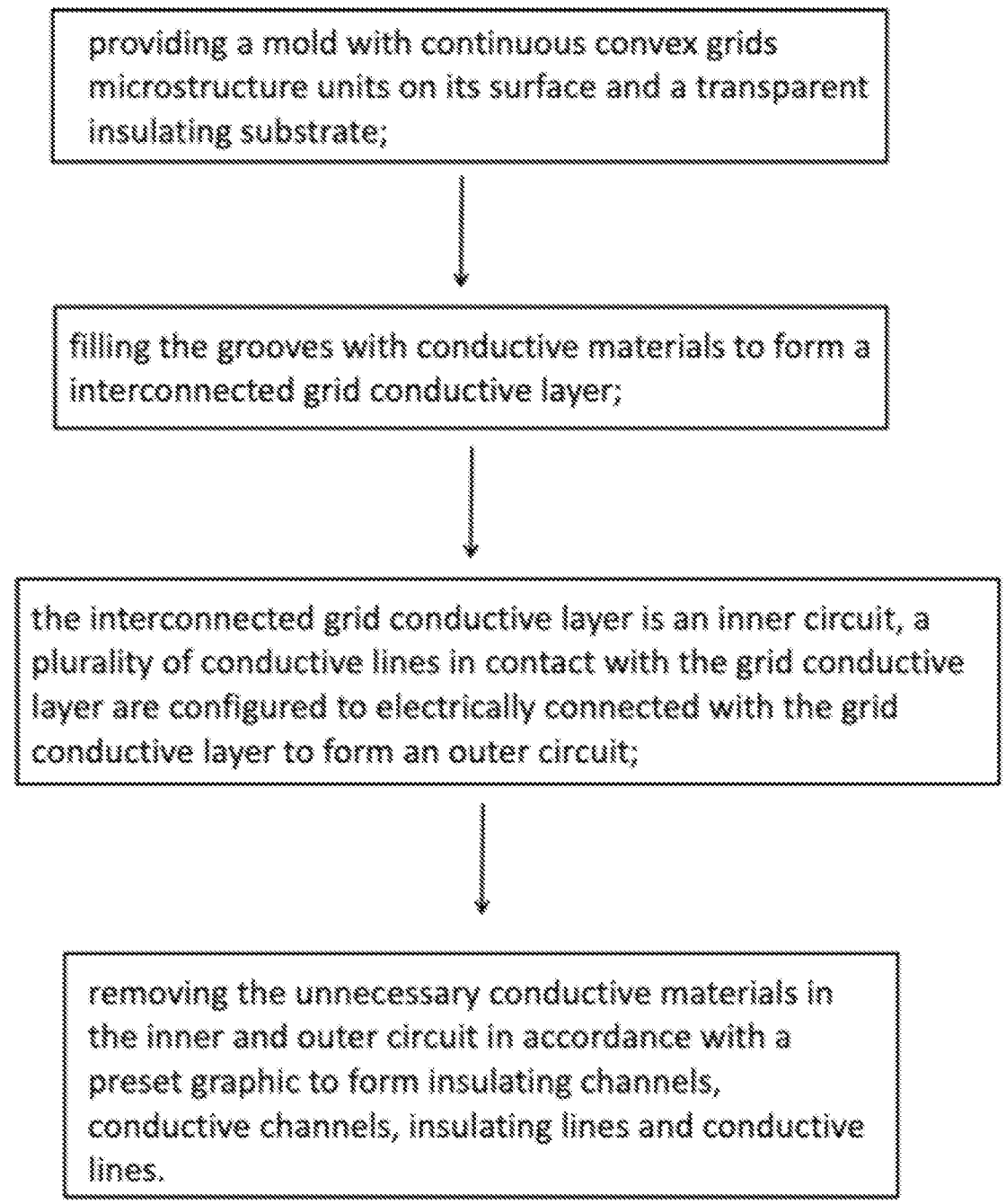

Referring to the flow chart shown in FIG. 1, the present invention provides a method for manufacturing a transparent conductive film, comprising the following steps:

providing a mold with continuous convex grids microstructure units on its surface;

providing a transparent insulating substrate;

exploiting the mold to stamping on the transparent insulating substrate to form continuous grooves;

filling the grooves with conductive materials to form an interconnected grid conductive layer;

the interconnected grid conductive layer is an inner circuit; a plurality of conductive lines in contact with the grid conductive layer are configured to electrically connect with the grid conductive layer to form an outer circuit;

removing the unnecessary conductive materials in the inner and outer circuit in accordance with a preset graphic to form insulating channels, conductive channels, insulating lines and conductive lines, and the conductive channels are electrically connecting to the conductive lines.

Furthermore, a plurality of conductive lines are directly formed on the conductive layer by screen printing or inkjet printing to electrically connect to the conductive layer, so as to generate an outer circuit. Then the outer circuit is etched by laser or chemicals according to the preset graphics. After that, unnecessary conductive materials etched by laser or chemicals are removed to form conductive channels which is insulating to each other.

In the present invention, the mold can be directly used to stamp on the transparent insulating substrate to create grooves corresponding to the microstructure units.

According to another embodiment, a gel layer is coated on the surface of the transparent insulating substrate, then a mold is used to stamp on the plane of the gel layer which is away from the transparent insulating substrate, after the gel layer is solidified, the grooves corresponding to the microstructure units are obtained.

Preferably, the etching condition through laser comprises: etching the inner circuit once, etching the outer circuit 2~3 times, depending on the circumstance influence; using a green laser for the process; employing steel wire mesh forme with a silk screen thickness of 5~15 µm to do the screen printing.

Figure 2:
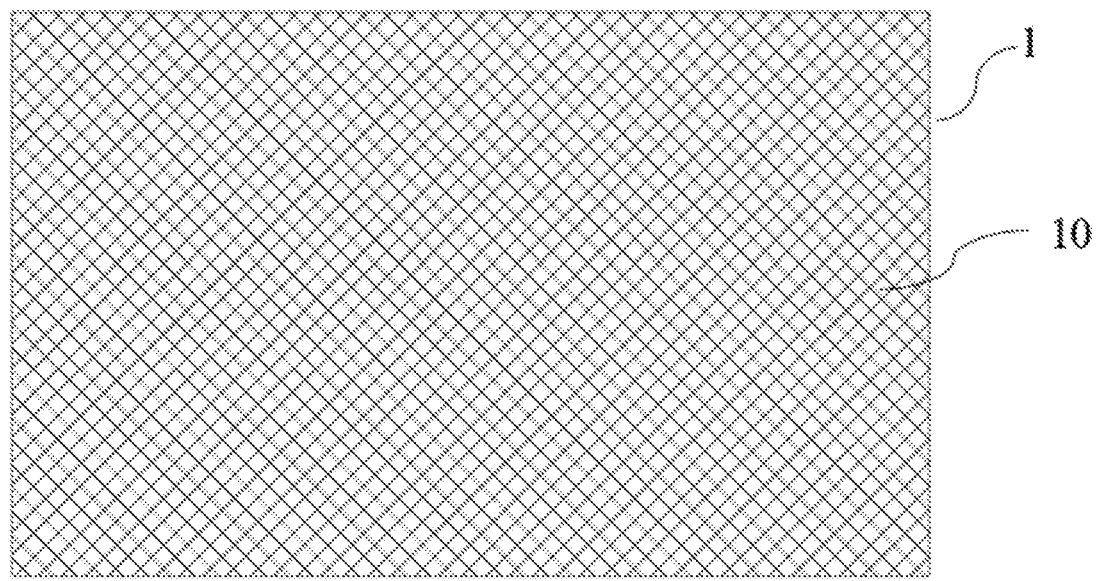

As shown in FIG. 2, the mold 1 contains a continuous convex microstructure unit 10 on the surface. The microstructure unit 10 is composed of uniformly or non-uniformly arranged and continuous grids that each has a shape of square, rectangle, rhombus, diamond, pentagon, hexagon, or random-shaped grid, etc. Preferably, the grids of the microstructure unit 10 are square, and they are uniformly, continuously, and compactly arranged on the surface of the mold1 in the horizontal direction.

The inner circuit and the outer circuit above-mentioned can be made of a same or some different materials, such as silver, copper, nickel or silver-copper composition.

The transparent insulating substrate is made of glass, PET, PC or PMMA.

The gel layer is made of acrylic photopolymer.

In order to curtail the cost, it is preferable to selectively fill the inner circuit and the contacting parts between the inner circuit and the outer circuit instead of the overall grooves. Since there are no conductive lines disposed on the outermost position of the preset outer circuit, it is unnecessary to be filled.

Generally, a manufacturing method disclosed in the present invention, comprises: stamping the microstructure unit 10 of the mold to a transparent insulating substrate or a gel layer on the substrate to generate embedded grids on the entire surface; filling the conductive materials to the grooves of the grids to form conductive layer; creating a outer circuit through screen printing or inkjet printing on the conductive layer; etching the conductive layer by laser or chemicals to obtain specific inner circuit and outer circuit so as to meet different needs; the line width of the metal grid and the spacing of the metal grid lines meet the need for transmittance; a unified grid design guarantees the overall visual effect for the products. Through the method of the present invention, different designed channels with one series of sizes can be processed with one mold, so that the cost for mold is decreased, the manufacturing cycle is shortened, and the universal applicability for the mold is improved. The significant savings in manufacturing cost and cycle will make a dramatic contribution to the industrial application.

A transparent conductive film produced by the method of the present invention is explained below:

With the reference to FIG. 3 to FIG. 7, a transparent conductive film of one exemplary embodiment comprises:

a transparent insulating substrate 20, further comprising an upper surface 201 and a lower surface 202 corresponding to the upper surface;

a gel layer 2 formed on the upper surface 201, comprising a first surface 21 away from the upper surface 201 and a second surface 22 corresponding to the upper surface 201, and the first surface 21 further comprises uniformly or non-uniformly arranged and interconnected grid grooves 23 on itself;

a concave inner circuit 3 configured on the first surface 21, containing a plurality of uniformly arranged conductive channels 31 and insulating channels 32 disposed between every two adjacent conductive channels, the grooves corresponding to the conductive channels 31 are filled with conductive materials 33 whereas the grooves corresponding to the insulating channels 32 are not filled;

a convex outer circuit 4 configured on the first surface 21, comprising a plurality of conductive lines 41 arranged according to a preset graphic and insulating lines 42 between every two adjacent conductive lines, and the conductive lines 41 are electrically connecting to the conductive channels 31 which are filled with conductive materials.

In the present invention, the grooves 23 are configured to match the convex parts of the microstructure unit 21, i.e., the adjacent grooves 23 are connected to each other to form a grid graphic. Then conductive materials are filled in the grooves to generate a conductive layer with a conductive function. According to an exemplary embodiment, the grooves are 1~10 µm deep and 1-5 µm wide, and the spacing between two adjacent grooves is 200~500 µm wide. Thus, the transmittance of the transparent conductive film can be maintained over 87%.

Figure 3:
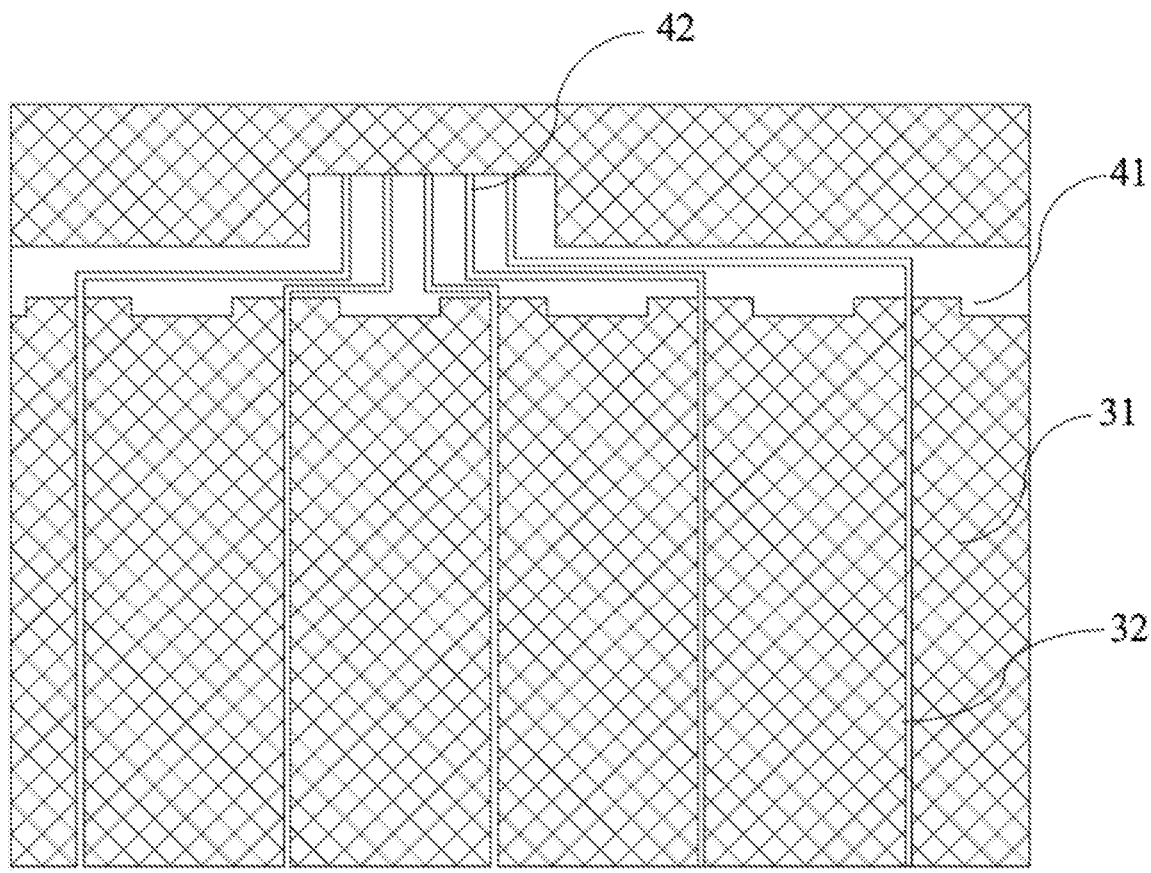
Figure 4:
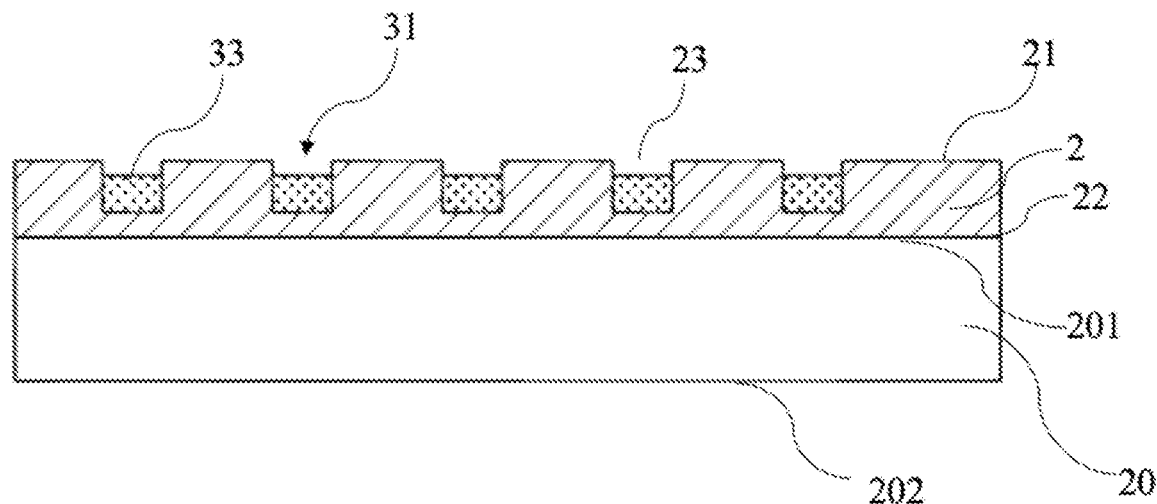
Figure 5:
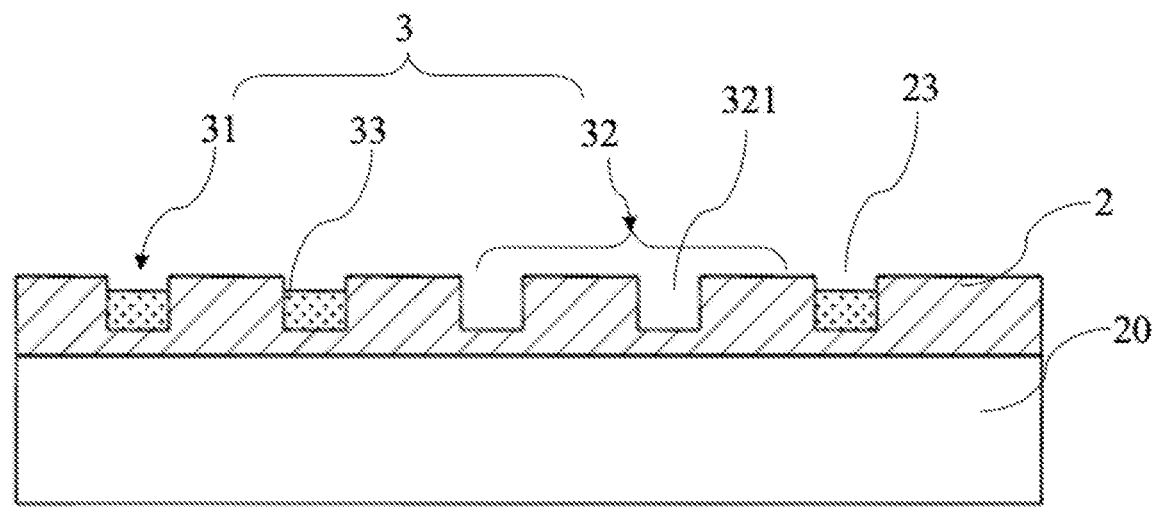
Figure 6:
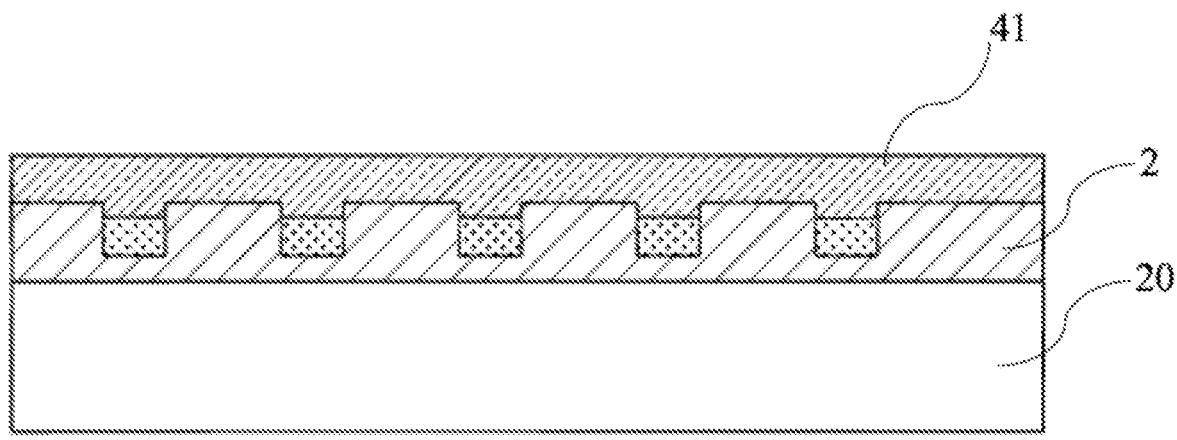
Figure 7:
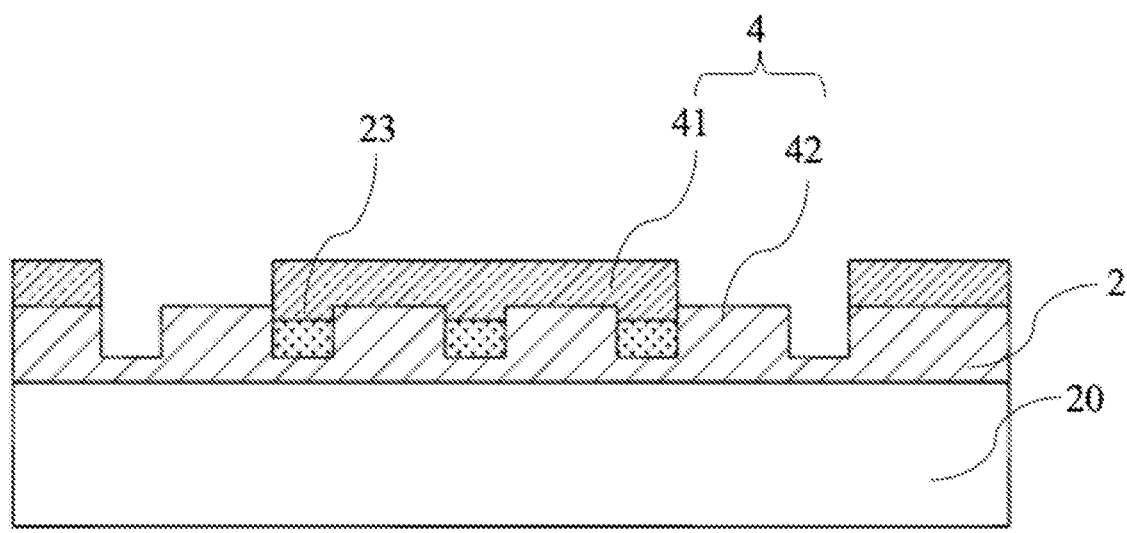

With reference to FIG. 3, FIG. 4 and FIG. 5, the uniformly arranged insulating channels 32 are produced by laser or chemicals etching. According to different specifications, these insulating channels 32 can be composed of a single or plurality of insulating sub-channels 321. Moreover, the width of the insulating sub-channel 321 is at least greater than the width of the groove 23. Preferably, the insulating channels 32 are 1 µm~100 mm wide, and the insulating sub-channels 321 are 1~25 µm wide. As shown in FIG. 6 and FIG. 7, the width of the conductive channels 41 ranges from 10 µm to 100 µm according to different specifications, preferably, the width is 10~30 µm.

As shown in FIG. 3, FIG. 6, and FIG. 7, the outer circuit 4 is produced by screen printing or inkjet printing, and the insulating lines 42 etched by laser or chemicals are arranged according to preset graphics to meet different requirements. The width of the insulating line is greater than the width of the groove 23 and smaller than the width between the two adjacent grooves 23. Whereas width of the conductive lines 41 disposed between the two adjacent insulating lines 42 can be same or not at different positions, which is not limited herein.

In the present invention, the gel layer 2 is 5~10 µm thick; the height of the conductive materials in the groove 23 is not limited.

Figure 8:
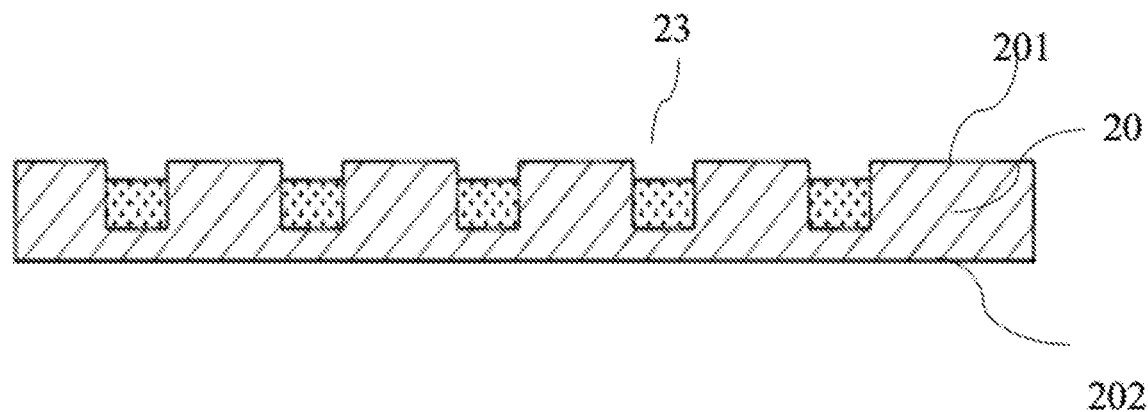
Figure 9:
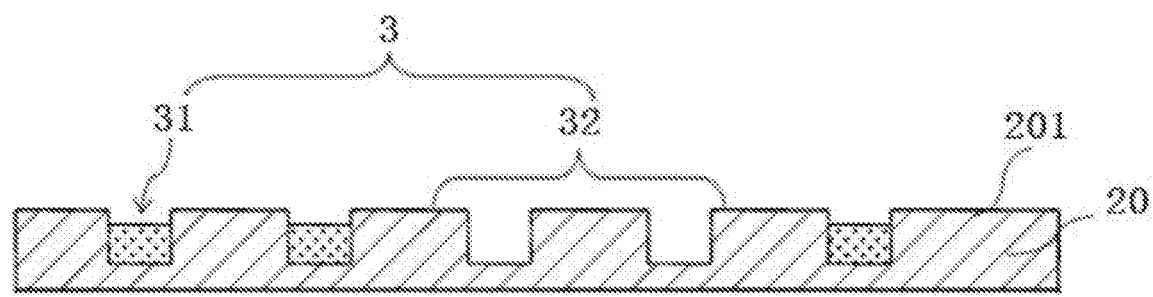
Figure 10:
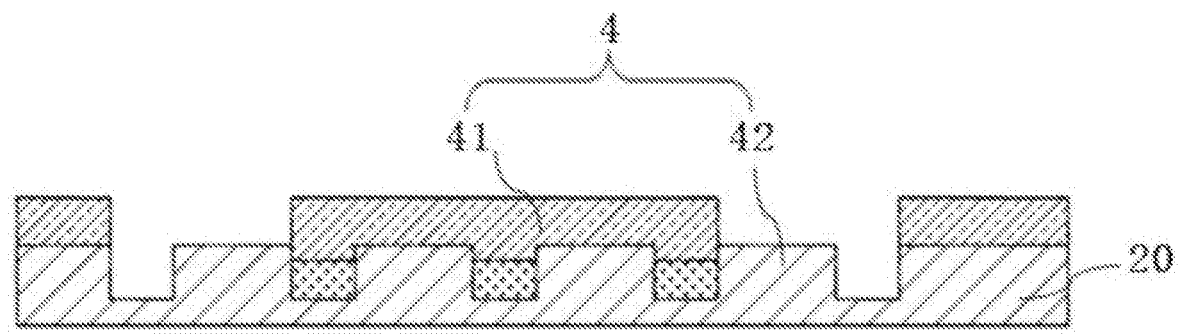

As shown in FIG. 8, FIG. 9, and FIG. 10, a transparent conductive film in one embodiment, comprises:

a transparent insulating substrate 20 defining: (i) a first surface 201 having a plurality of uniformly or non-uniformly arranged and interconnected grid grooves 23 on itself; (ii) a second surface 202 corresponding to the first surface;

a concave inner circuit 3 configured on the first surface 201, comprising a plurality of uniformly arranged conductive channels 31 and insulating channels 32 between every two conductive channels, and the grooves 23 corresponding to the conductive channels 31 are filled with conductive materials whereas the grooves 23 corresponding to the insulating channels 32 are not filled;

a convex outer circuit 4 configured on the edge of the first surface 201, comprising a plurality of conductive lines 41 arranged according to a preset graphic and insulating lines 42 between every two conductive lines, and the conductive lines 41 are electrically connecting to the conductive channels 31 which are filled with conductive materials.

The present invention discloses a touch panel as well, which comprises a transparent conductive film prepared by the foregoing method. Herein the transparent conductive film works as a driving electrode or sensing electrode, or simultaneously woks as a driving electrode and sensing electrode.

In conclusion, the present invention discloses a method for manufacturing a transparent conductive film, including: using a general-purpose mold to stamp on a substrate to obtain grid grooves; filling conductive materials to produce a inner circuit; forming an outer circuit through screen printing or inkjet printing method; exploiting laser or chemicals etching method to generate insulating channels and lines on the inner circuit and outer circuit, so that the layout design of the inner and outer circuit can be flexibly modified according to different design requirements instead of fabricating specific molds, so as to shorten the development cycle, cut down the cost for fabricating molds, and enormously improve the industrial production efficiency. The embedded imprint process can meet the requirements for the large-scale products with a resistance usually less than $10\Omega^2$. Meanwhile, the method for laser or chemicals etching helps to realize the narrow frame design.

All embodiments and conditions recited herein are to be construed as being without limitation to such specifically recited embodiments and conditions. It should be understood that those skilled in the art could make various change, substitutions, and alterations without departing from the true scope and spirit of the invention that are intended to be included in the scope of the present invention.

We claim:

1. A method for manufacturing a transparent conductive film, the method comprising:
    providing a mold with continuous convex grids microstructure units on its surface;
    providing a transparent insulating substrate;
    exploiting the mold to stamping on the transparent insulating substrate to form continuous grooves;
    filling the grooves with conductive materials to form an interconnected grid conductive layer;
    the interconnected grid conductive layer is an inner circuit; a plurality of conductive lines in contact with the grid conductive layer are configured to electrically connect with the grid conductive layer to form an outer circuit;
    removing the unnecessary conductive materials in the inner and outer circuit in accordance with a preset graphic to form insulating channels, conductive channels, insulating lines and conductive lines, and the conductive channels are configured to electrically connect to the conductive lines.

2. The method for manufacturing a transparent conductive film of claim 1, wherein the transparent insulating substrate is a single layer substrate, and the grooves are formed on the substrate.

3. The method for manufacturing a transparent conductive film of claim 1, wherein the transparent insulating substrate includes a substrate and a gel layer coating on the substrate, and the grooves are formed on the gel layer.

4. The method for manufacturing a transparent conductive film of claim 1, wherein the outer circuit is formed by screen printing or inkjet printing with conductive slurries; the inner and outer circuits are etched by laser or chemicals according to the preset graphics, and then the unnecessary slurries are removed from the etched grooves to form the insulating channels and conductive channels.

5. The method for manufacturing a transparent conductive film of claim 1, wherein the outer circuit is formed at the edge of the side in contact with the conductive layer specifically through three ways: the outer circuit is tangent to the inner circuit; or the outer circuit extends into the inner circuit; or the outer circuit partly intersects the inner circuit, i.e., lap mode.

6. The method for manufacturing a transparent conductive film of claim 1, wherein the grids microstructure units are composed of continuous grids in uniform or non-uniform arrangement, the shape of the grid is one or a combination of at least two from the shapes of square, rectangle, rhombus, diamond, pentagon, hexagon, and random-shaped grid.

\* \* \* \* \*